(12) United States Patent
Kim et al.

(10) Patent No.: US 10,060,990 B2
(45) Date of Patent: Aug. 28, 2018

(54) SHIELDING APPARATUS, SHIELDING METHOD AND DEMAGNETIZING FOR MEASURING MAGNETIC FIELD

(71) Applicant: Korea Research Institute of Standards and Science, Daejeon (KR)

(72) Inventors: Ki Woong Kim, Daejeon (KR); Yong Ho Lee, Daejeon (KR); Kwon Kyu Yu, Daejeon (KR); Seong-Joo Lee, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 167 days.

(21) Appl. No.: 14/768,898

(22) PCT Filed: Mar. 8, 2013

(86) PCT No.: PCT/KR2013/001884
§ 371 (c)(1),
(2) Date: Aug. 19, 2015

(87) PCT Pub. No.: WO2014/137012
PCT Pub. Date: Sep. 12, 2014

(65) Prior Publication Data
US 2016/0011278 A1    Jan. 14, 2016

(51) Int. Cl.
*G01N 27/72* (2006.01)
*G01R 33/00* (2006.01)
(Continued)

(52) U.S. Cl.
CPC ....... *G01R 33/0076* (2013.01); *G01R 33/025* (2013.01); *H05K 9/0069* (2013.01); *H01F 13/003* (2013.01)

(58) Field of Classification Search
CPC .............................. G01R 33/12; G01N 27/023
(Continued)

(56) References Cited

U.S. PATENT DOCUMENTS 5,373,275 A    12/1994    Itoh et al.
2005/0162249 A1    7/2005    Simola
(Continued)

FOREIGN PATENT DOCUMENTS

| JP | 2008-140806 A | 6/2008 |
| JP | 2008-288328 A | 11/2008 |
| KR | 20-0177944 Y1 | 4/2000 |

OTHER PUBLICATIONS

Partial Translation of JP 2008-288328 A, Nov. 2008.*

*Primary Examiner* — Bot Ledynh
(74) *Attorney, Agent, or Firm* — Hoffmann & Baron, LLP

(57) ABSTRACT

The present invention relates to a shield apparatus and a shield method for measuring a subtle magnetic field. More specifically, the present invention relates to a shield apparatus having a precise magnetic sensor therein, for shielding an external magnetic field in a subtle magnetic field measurement apparatus including a magnetic field generation apparatus for exciting a sample, the shield apparatus for measuring a subtle magnetic field, including: a shield wall provided with a high-conductivity metal layer of high conductivity being partitioned into a plurality of segments and having a high-frequency shield property and a closed high-permeability soft magnetic layer spaced apart from the high-conductivity metal layer by a predetermined distance, so as to seal a measurement space.

20 Claims, 6 Drawing Sheets

(51) Int. Cl.
*H05K 9/00* (2006.01)
*G01R 33/025* (2006.01)
*H01F 13/00* (2006.01)

(58) Field of Classification Search
USPC .......................................... 324/225; 174/386
See application file for complete search history.

(56) References Cited

U.S. PATENT DOCUMENTS

2006/0091881 A1\* 5/2006 Clarke et al. ................. 324/301
2012/0226135 A1\* 9/2012 Okada ........................... 600/409

\* cited by examiner

[Fig. 1]
Prior Art
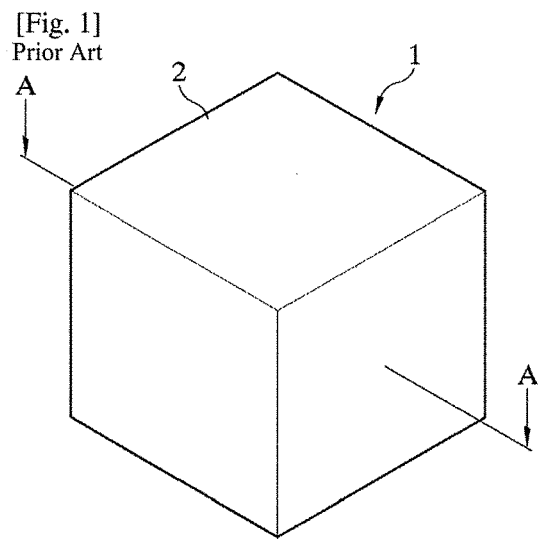
[Fig. 2]
Prior Art
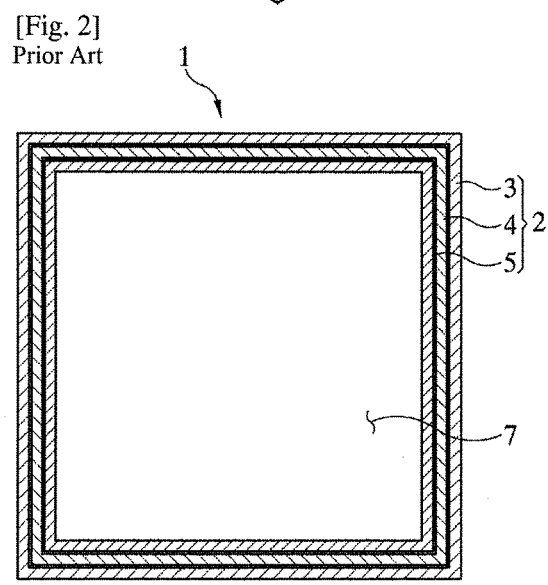
[Fig. 3]
Prior Art
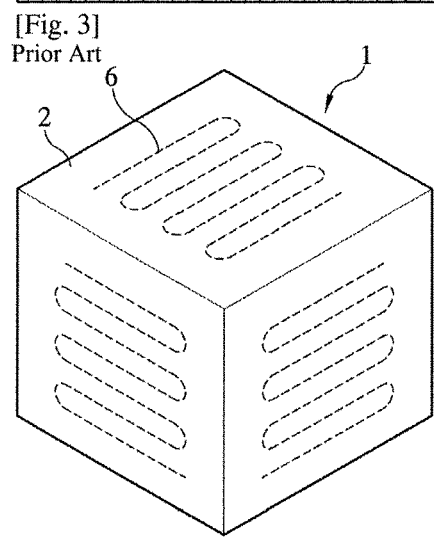

[Fig. 4]
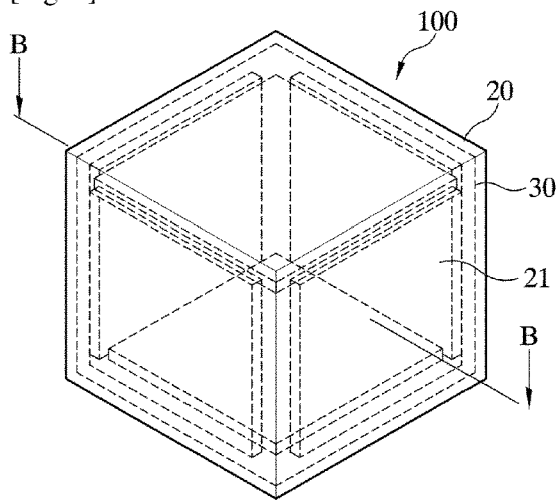
[Fig. 5]
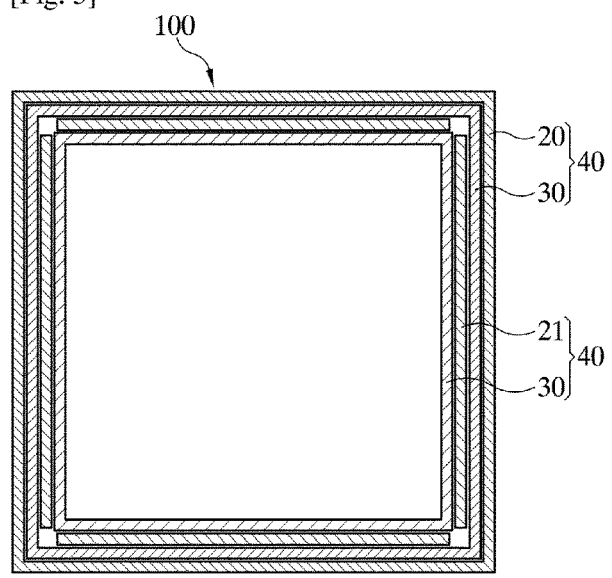
[Fig. 6]
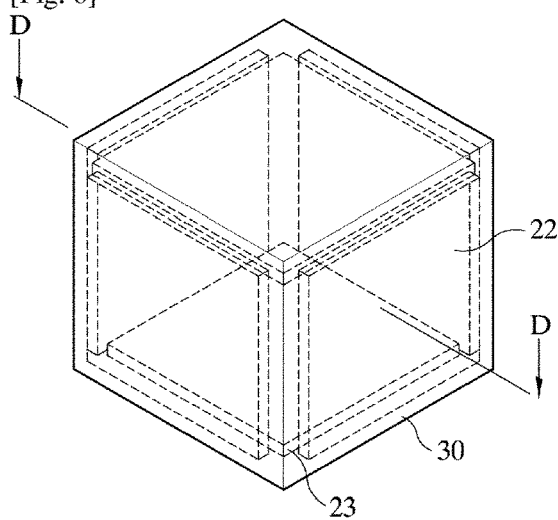

[Fig. 7]
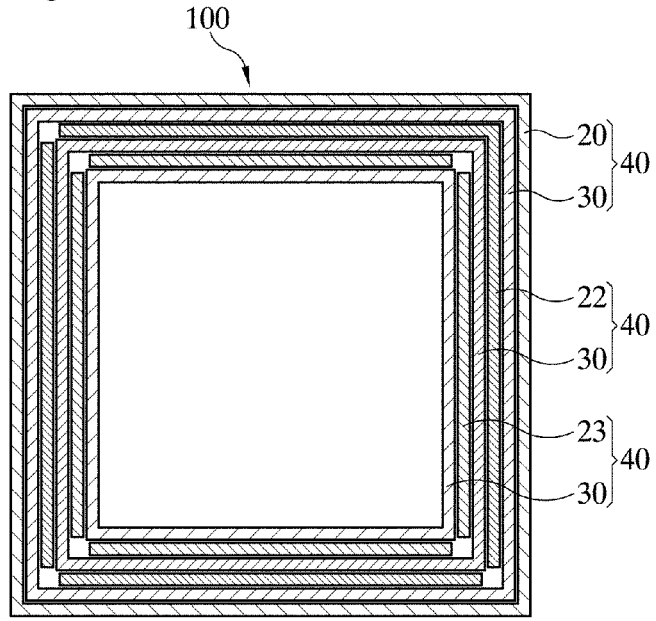
[Fig. 8]
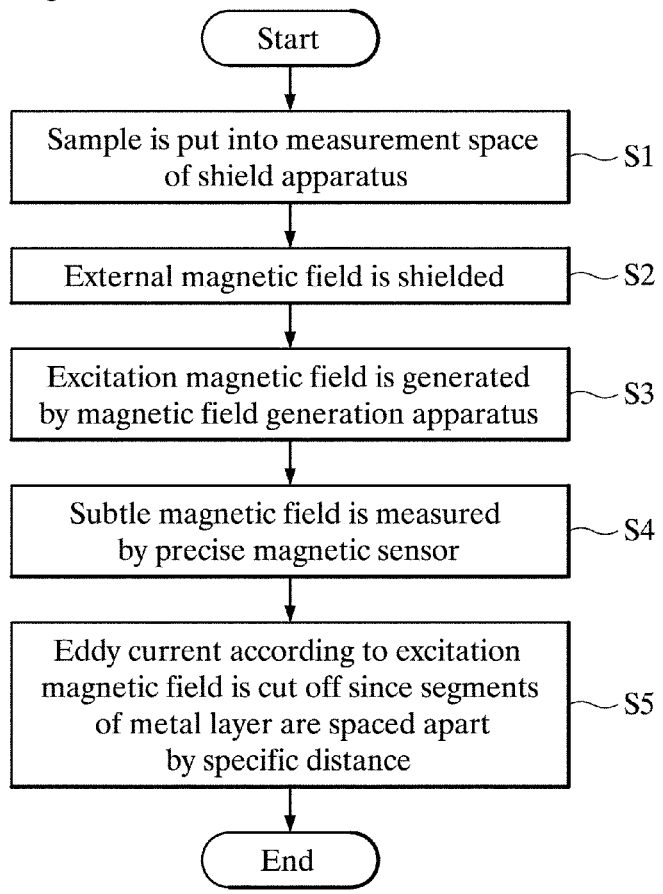

[Fig. 9]
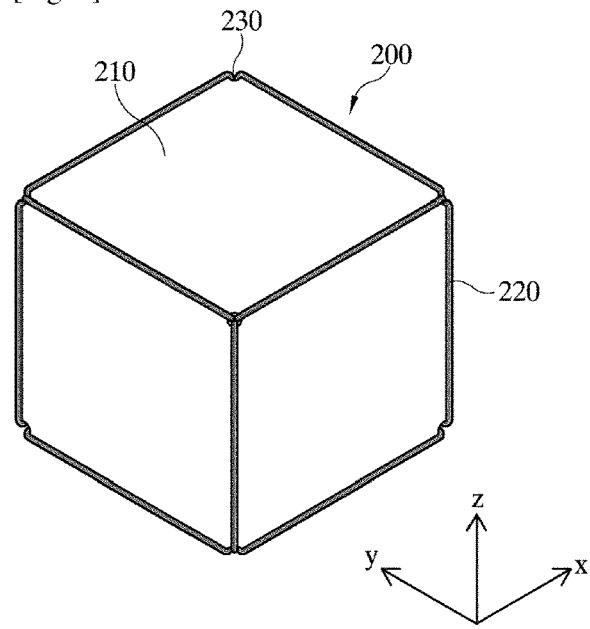
[Fig. 10]
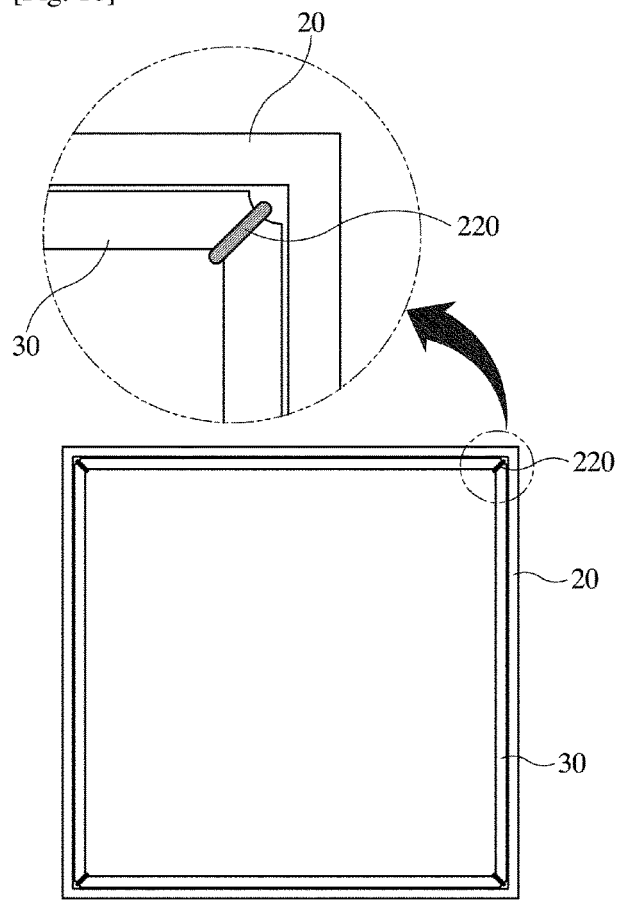

[Fig. 11]
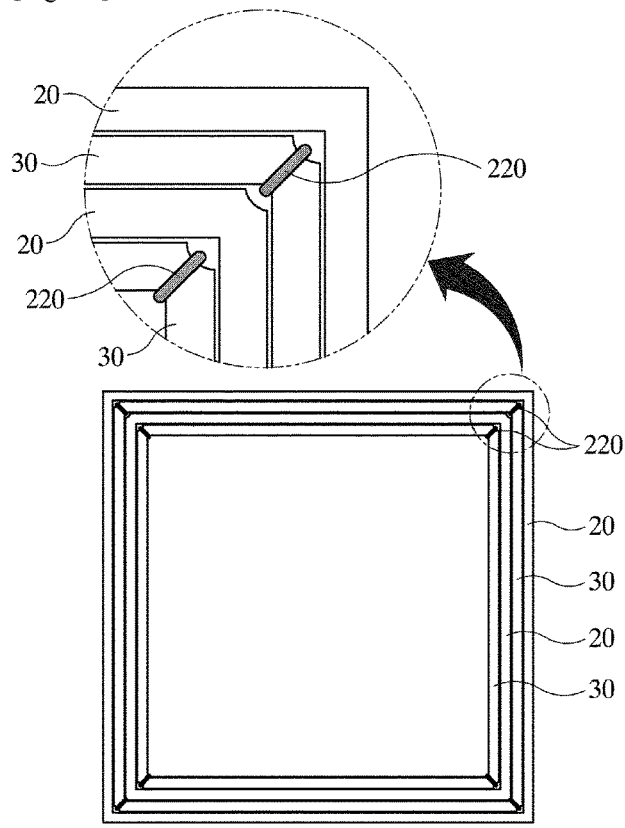
[Fig. 12]
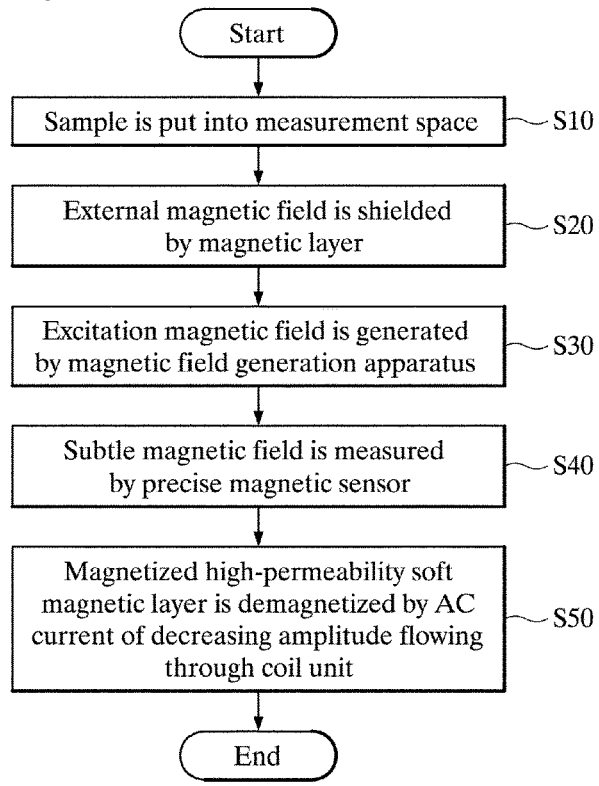

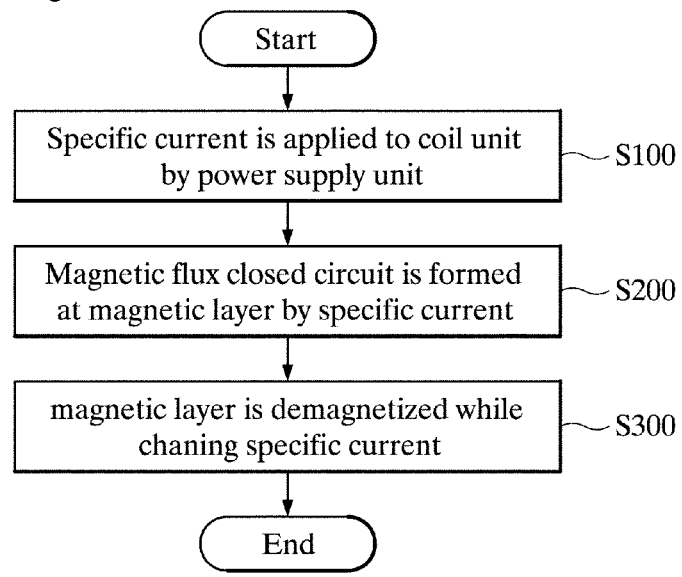
[Fig. 13]

… (1)

SHIELDING APPARATUS, SHIELDING METHOD AND DEMAGNETIZING FOR MEASURING MAGNETIC FIELD

CROSS-REFERENCE TO RELATED APPLICATIONS

This application is the U.S. National Phase of International Patent Application No. PCT/KR2013/001884, filed on 8 Mar. 2013, the contents of which are incorporated herein by reference in their entirety.

TECHNICAL FIELD

The present invention relates to a shield apparatus and a shield method for measuring a subtle magnetic field. More specifically, the present invention relates to a shield apparatus and a shield method for measuring a subtle magnetic field, in which a shield wall configuring the shield apparatus is formed as a high-conductivity metal layer partitioned into a plurality of segments, and a plurality of coil units respectively penetrating a corner is provided in each shield wall, and thus an eddy current flowing along the shield apparatus can be prevented, and the shield wall can be demagnetized.

BACKGROUND ART

A shield room configuring a shield apparatus effectively shields a high-frequency magnetic field, as well as a direct current (DC) low-frequency magnetic field, based on both a magnetic field shield effect obtained using a soft magnetic material of high permeability and an eddy current shield effect obtained using a metal of high electrical conductivity. Such a shield room is generally manufactured in double or triple walls in order to enhance shield effectiveness, and each of the walls is formed in dual layers of a soft magnetic layer and a high-conductivity metal layer.

FIG. 1 is a perspective view showing a shield apparatus 1 provided with a shield room 2 having multiple walls according to a prior art, and FIG. 2 is a cross-sectional view showing a shield apparatus 1 provided with a shield room 2 having multiple walls according to a prior art. That is, FIG. 2 is a cross-sectional view taken along the line A-A of FIG. 1. As shown in FIGS. 1 and 2, the shield room 2 having multiple walls of the prior art uses a magnetic material such as Mu-metal, permalloy or the like containing nickel as a material having high permeability for all inner layers regardless of magnetic field strength in a space. Then, the distance between the walls is about 10 to 30 cm, and a metal layer 4 formed of aluminum having high conductivity is installed as an outer layer of each wall.

In the shield apparatus 1 of the prior art, a subtle magnetic field generated from a sample provided in an internal measurement space 7 is measured by a precise magnetic sensor (not shown). However, when a strong magnetic field is applied inside the shield apparatus 1 in order to excite the sample, in the shield apparatus 1 of the prior art, an eddy current is generated at the high-conductivity metal layer of the shield room 2, or the soft magnetic layer is magnetized by an excitation magnetic field. The eddy current is generated in the shield room 2 since each of the layers configuring the shield room 2 is formed as an all-connected closed surface structure as shown in FIGS. 1 and 2. That is, if an induced magnetic field is generated at the shield wall, the eddy current flows along the closed circuit for an extended period of time, and thus there is a problem in that a subtle magnetic field of the sample provided in the measurement space cannot be measured precisely due to the strong magnetic field generated by the continuous eddy current.

In addition, when the shield room 2 configuring the shield apparatus 1 is magnetized by the excitation magnetic field, in the prior art, a plurality of coil units 6 is insertedly installed on the surface of the soft magnetic layer, which is an inner layer of the shield wall, and a method of demagnetizing the soft magnetic layer by applying current to the coil units 6 is used. FIG. 3 is a perspective view showing a shield apparatus including coil units 6 inserted inside a shield wall according to a prior art. However, such a method has a problem in that it is difficult to insert a plurality of coils inside the shield room in manufacturing the shield apparatus, and manufacturing cost thereof is increased. Furthermore, when the coil units 6 are inserted inside the shield walls as shown in FIG. 3, the induced magnetic field generated by applying current to the coil units 6 may not reach the corners of the shield room 2, and thus there is a limit in demagnetizing the front surface of the shield room 2.

Accordingly, in order to solve the problems of the shield apparatus of the prior art, required are a shield apparatus and a method thereof capable of reducing the eddy current generated by the excitation magnetic field generated in the measurement space of the shield apparatus and efficiently demagnetizing the magnetized shield room.

SUMMARY

Technical Problem

Therefore, the present invention has been made in view of the above problems, and according to an embodiment of the present invention, there is provides a shield apparatus and a method thereof, in which since a high-conductivity metal layer of each shield wall is configured to be partitioned differently, flow of eddy current induced at the high-conductivity metal layer by an excitation magnetic field generated inside the shield room can be cut off, and thus the effect of the eddy current generated by the magnetic field is minimized.

In addition, according to another embodiment of the present invention, there is provides a shield apparatus and a method thereof, in which since a plurality of coil units formed by winding a coil to penetrate each corner of a high-permeability soft magnetic layer configuring the shield room is provided, the front surface of the high-permeability soft magnetic layer configuring the shield room is demagnetized by applying current to the coil units by a power supply unit.

The other objects, specific advantages and new features of the present invention will be further clarified from the following detailed descriptions and preferred embodiments made with reference to the accompanying drawings.

Solution to Problem

A first object of the present invention can be accomplished by a shield apparatus having a precise magnetic sensor therein, for shielding an external magnetic field in a subtle magnetic field measurement apparatus including a magnetic field generation apparatus for exciting a sample, the shield apparatus for measuring a subtle magnetic field, including: a shield wall provided with a high-conductivity metal layer of high conductivity being partitioned into a plurality of segments and having a high-frequency shield property and a closed high-permeability soft magnetic layer spaced apart from the high-conductivity metal layer by a predetermined distance, so as to seal a measurement space, in which the external magnetic field is shielded, and flow of eddy current induced by an excitation magnetic field generated by the magnetic field generation apparatus is cut off, so that a magnetic field generated by the eddy current does not interfere measuring the subtle magnetic field.

The shield wall is formed as multiple walls, and all surfaces of the high-conductivity metal layer configuring an outermost shield wall are closed.

The shield wall includes a door that can be opened and closed to put in the sample and to input and output other apparatuses, and all the surfaces of the high-conductivity metal layer of the outermost shield wall are closed when the door is closed.

Since all the surfaces of the high-conductivity metal layer of the outermost shield wall are closed, and the high-conductivity metal layer surrounding the measurement space is further partitioned as the shield wall thereof is positioned at a further inner side, the area of the high-conductivity metal layer is decreased.

The high-conductivity metal layer is formed of at least one of aluminum, copper, brass, silver and gold.

The high-permeability soft magnetic layer is formed of at least one of Mu-metal, permalloy, hypernom, ferrite and Magnifer 7904.

A second object of the present invention can be accomplished by a shield method for measuring a subtle magnetic field using the shield apparatus according to claim 1, the method including the steps of: putting a sample into a measurement space of a shield wall provided with a high-conductivity metal layer of high conductivity being partitioned into a plurality of segments and having a high-frequency shield property and a closed high-permeability soft magnetic layer spaced apart from the high-conductivity metal layer by a predetermined distance, so as to seal a measurement space; shielding an external magnetic field by the shield wall; generating an excitation magnetic field by a magnetic field generation apparatus provided in the measurement space to excite the sample; and measuring the subtle magnetic field generated from the sample by a precise magnetic sensor provided in the measurement space, in which in the steps of generating an excitation magnetic field and measuring the subtle magnetic field, since end surfaces of the segments of the high-conductivity metal layer partitioned into a plurality of segments are spaced apart from each other by a predetermined distance, flow of eddy current flowing through the high-conductivity metal layer by the excitation magnetic field generated by the magnetic field generation apparatus is cut off, and thus the precise magnetic sensor avoids measuring an unnecessary induced magnetic field.

The shield wall is formed as multiple walls, and since all surfaces of the high-conductivity metal layer of an outermost shield wall are closed, and the high-conductivity metal layer surrounding the measurement space is further partitioned as the shield wall thereof is positioned at a further inner side, the area of the high-conductivity metal layer is decreased.

A third object of the present invention can be accomplished by a shield apparatus having a precise magnetic sensor therein, for shielding an external magnetic field in an apparatus for measuring a subtle magnetic field of a sample, the shield apparatus for measuring the subtle magnetic field, including: a sealed shield room provided with a shield wall and a measurement space inside thereof, the shield wall including a high-conductivity metal layer of high conductivity having a high-frequency shield property and a high-permeability soft magnetic layer of high permeability being spaced apart from the high-conductivity metal layer by a predetermined distance toward inside thereof and having a low-frequency magnetic field shield property; a plurality of holes respectively formed at each vertex of the high-permeability soft magnetic layer; a plurality of coil units respectively formed by inserting a coil into a hole and another hole adjacent to the hole and winding the coil around each corner of the high-permeability soft magnetic layer; and a power supply unit configured to apply current to the coil units.

When four coils wound in parallel to each other in each of three independent axis directions of length, height and depth-wise directions of the high-permeability soft magnetic layer of a hexahedron are defined as a coil group, the coil unit has an electrical wiring which configures three independent coil groups by connecting the defined coil groups in series or in parallel, and when current is applied to a specific coil group, a magnetic flux closed circuit of a same direction is created along four surfaces of the hexahedron configuring the high-permeability soft magnetic layer.

The high-permeability soft magnetic layer is formed of at least one of Mu-metal, permalloy, ferrite, hypernom and Magnifer 7904.

When the high-permeability soft magnetic layer is magnetized, the power supply unit applies AC current of an amplitude continuously decreasing along time to the electrical wiring configuring the coil group to form an induced magnetic field at the magnetized high-permeability soft magnetic layer, and thus the high-permeability soft magnetic layer is demagnetized.

A fourth object of the present invention can be accomplished by a shield method for measuring a subtle magnetic field using the shield apparatus according to claim 9, the method including the steps of: putting a sample into a measurement space of a sealed shield room provided with a plurality of holes respectively formed at each vertex, a high-permeability soft magnetic layer of high permeability having a low-frequency shield property and a high-conductivity metal layer of high conductivity having a high-frequency shield property; shielding an external magnetic field by the shield room; generating an excitation magnetic field by a magnetic field generation apparatus installed to excite the sample; measuring the subtle magnetic field generated from the sample by a precise magnetic sensor provided in the measurement space; and demagnetizing the high-permeability soft magnetic layer magnetized by the excitation magnetic field, by applying AC current of a continuously decreasing amplitude flowing through a plurality of coil units respectively formed by inserting a coil into a hole and another hole adjacent to the hole and winding the coil around each corner.

A fifth object of the present invention can be accomplished by a demagnetizing method for measuring a subtle magnetic field using the shield apparatus according to claim 12, the method including the steps of: when a high-permeability soft magnetic layer of high permeability having a low-frequency shield property and configuring a sealed shield room is magnetized, applying a specific current by a power supply unit to a plurality of coil units respectively formed by inserting a coil into a plurality of holes respectively provided at each vertex of the high-permeability soft magnetic layer and other holes adjacent to the holes and winding the coil around each corner; creating a magnetic flux closed circuit at the high-permeability soft magnetic layer by the specific current; and demagnetizing the high-permeability soft magnetic layer by changing a value of the specific current.

Advantageous Effects of Invention

Therefore, according to an embodiment of the present invention as described above, it is effective in that since a high-conductivity metal layer of each shield wall is configured to be partitioned into a plurality of different segments, flow of eddy current induced at the high-conductivity metal layer by an excitation magnetic field generated inside a shield room can be cut off, and thus the effect of the eddy current generated by the magnetic field can be minimized.

In addition, according to another embodiment of the present invention, it is effective in that since a plurality of coil units formed by winding a coil to penetrate each corner of a high-permeability soft magnetic layer configuring the shield room is provided, the front surface of the high-permeability soft magnetic layer configuring the shield room is demagnetized by applying current to the coil units by a power supply unit.

BRIEF DESCRIPTION OF DRAWINGS

FIG. 1 is a perspective view showing a shield apparatus provided with a shield room having multiple walls according to a prior art.

FIG. 2 is a cross-sectional view showing a shield apparatus provided with a shield room having multiple walls according to a prior art.

FIG. 3 is a perspective view showing a shield apparatus including coil units inserted inside a shield wall according to a prior art.

FIG. 4 is a perspective view showing a shield apparatus having a high-conductivity metal layer partitioned into a plurality of segments according to a first embodiment of the present invention.

FIG. 5 is a cross-sectional view showing a shield apparatus having a high-conductivity metal layer partitioned into a plurality of segments according to a first embodiment of the present invention.

FIG. 6 is a perspective view showing a shield apparatus having a high-conductivity metal layer partitioned into a plurality of segments according to a second embodiment of the present invention.

FIG. 7 is a perspective view showing a shield apparatus having a high-conductivity metal layer partitioned into a plurality of segments according to a second embodiment of the present invention.

FIG. 8 is a flowchart illustrating a shield method using a shield apparatus having a high-conductivity metal layer partitioned into a plurality of segments according to an embodiment of the present invention.

FIG. 9 is a perspective view showing a shield apparatus including coil units respectively formed at each corner according to a first embodiment of the present invention.

FIG. 10 is a cross-sectional view showing a shield apparatus including coil units respectively formed at each corner and having multiple shield walls according to a second embodiment of the present invention.

FIG. 11 is a cross-sectional view showing a shield apparatus including coil units respectively formed at each corner and having multiple shield walls according to a third embodiment of the present invention.

FIG. 12 is a flowchart illustrating a shield method using a shield apparatus including coil units respectively formed at each corner according to an embodiment of the present invention.

FIG. 13 is a flowchart illustrating a demagnetizing method using a shield apparatus including coil units respectively formed at each corner according to an embodiment of the present invention.

DESCRIPTION OF SYMBOLS

1: Shield apparatus of prior art
2: Shield room of prior art
3: Outer wall
4: Metal layer
5: Inner wall
6: Coil unit of prior art
7: Measurement space
20: High-conductivity metal layer
21: Partitioned high-conductivity metal layer
22: Partitioned first high-conductivity metal layer
23: Partitioned second high-conductivity metal layer
30: High-permeability soft magnetic layer
40: Shield wall
100: Shield apparatus having high-conductivity metal layer partitioned into a plurality of segments (<<a plurality of partitioned high-conductivity metal layers)
200: Shield apparatus having coil units
210: Shield room
220: Coil unit
230: Hole

DETAILED DESCRIPTION

The preferred embodiments of the present invention that can be easily practiced by those skilled in the art will be hereafter described in detail with reference to the accompanying drawings. In addition, if already known functions or specific description of constitution related to the present invention may make the spirit of the present invention unclear, detailed description thereof will be omitted.

In the drawings illustrating the embodiments of the invention, elements having like functions will be denoted by like reference numerals and details thereon will not be repeated. Throughout the specification, when an element is connected to another element, it includes a case of indirectly connecting the elements with intervention of another element therebetween, as well as a case of directly connecting the elements. In addition, the concept of including a constitutional element means further including another constitutional element, not excluding another constitutional element, as far as an opposed description is not specially specified.

Hereinafter, the configuration and action of a shield apparatus 100 having a high-conductivity metal layer 21 partitioned into a plurality of segments according to an embodiment of the present invention will be described. First, FIG. 4 is a perspective view showing a shield apparatus 100 having a high-conductivity metal layer 21 partitioned into a plurality of segments according to a first embodiment of the present invention. In addition, FIG. 5 is a cross-sectional view showing a shield apparatus 100 having a high-conductivity metal layer 21 partitioned into a plurality of segments according to a first embodiment of the present invention. That is, FIG. 5 is a cross-sectional view taken along the line B-B of FIG. 4.

As shown in FIGS. 4 and 5, the shield apparatus 100 having a high-conductivity metal layer 21 partitioned into a plurality of segments according to an embodiment of the present invention includes a shield wall 40 having a high-conductivity metal layer and a high-permeability soft magnetic layer installed to be spaced apart from the high-conductivity metal layer by a predetermined distance toward inside thereof, and it is understood that the shield wall 40 is formed in double walls.

Specifically, a shield wall 40 installed at an outer side has a high-conductivity metal layer 20 of a sealed hexahedron shape (not limited to such a hexahedron shape) and a high-permeability soft magnetic layer 30 of a sealed hexahedron shape, which is provided to be spaced apart from the high-conductivity metal layer 20 by a predetermined distance toward inside thereof. In addition, a shield wall 40 installed at an inner side has a high-conductivity metal layer 21 partitioned into a plurality of segments and a high-permeability soft magnetic layer 30 of a sealed hexahedron shape.

The shield apparatus 100 according to a first embodiment of the present invention is sealed by an outer shield wall 40 and a shield wall 40 provided at an inner side, which has a high-conductivity metal layer 21 partitioned into a plurality of segments, and has a measurement space 7 inside thereof. Accordingly, a sample is put into the measurement space 7, and a subtle magnetic field generated from the sample is measured by a precise magnetic sensor provided in the measurement space 7. Since such a partitioned high-conductivity metal layer 21 is included, flow of eddy current induced by a strong excitation magnetic field, which is generated by a magnetic field generation apparatus for exciting the sample provided inside the measurement space 7, is cut off.

In a first embodiment of the present invention, a material of high conductivity having a high-frequency shield property is used for the high-conductivity metal layer 20 and the partitioned high-conductivity metal layer 21. For example, they can be formed of aluminum, copper, brass, silver, gold or the like. However, such a configuration is only a proposal of an embodiment, and if a metal has an excellent electrical conductivity, the scope of right should not be interpreted to be limited to the materials. In addition, the high-permeability soft magnetic layer 30 according to a first embodiment of the present invention is formed of Mu-metal, permalloy, hypernom, ferrite, Magnifer 7904 or the like, and if it is a soft magnetic material of high-permeability, the high-permeability soft magnetic layer 30 is not limited to a specific material.

In addition, it is understood that the high-conductivity metal layer 21 according to a first embodiment of the present invention is configured to be partitioned into six segments as shown FIGS. 4 and 5 and installed between the high-permeability soft magnetic layers 30 to be spaced apart form each other by a predetermined distance. Accordingly, the end portions of the partitioned segments of the high-conductivity metal layer 21 are spaced apart from each other by a predetermined distance and form a gap. Since a gap of a specific distance is formed between the partitioned segments of the high-conductivity metal layer 21, flow of eddy current generated by an excitation magnetic field, which is generated by the magnetic field generation apparatus for exciting the sample, is cut off.

That is, since all the surfaces are connected in the case of the conventional shield apparatus 100, the eddy current flows through the metal layer due to the excitation magnetic field generated in the measurement space 7 of the shield apparatus 100. However, since the shield apparatus 100 having a partitioned high-conductivity metal layer 21 according to a first embodiment of the present invention forms a gap of a specific distance between the partitioned segments of the high-conductivity metal layer 21, flow of the eddy current is cut off.

Hereinafter, the configuration and action of a shield apparatus 100 having a high-conductivity metal layer 21 partitioned into a plurality of segments according to a second embodiment of the present invention will be described. First, FIG. 6 is a perspective view showing a shield apparatus 100 having a high-conductivity metal layer 21 partitioned into a plurality of segments according to a second embodiment of the present invention. In addition, FIG. 7 is a cross-sectional view showing a shield apparatus 100 having a high-conductivity metal layer 21 partitioned into a plurality of segments according to a second embodiment of the present invention. That is, FIG. 7 is a cross-sectional view taken along the line C-C of FIG. 6. It is understood that the shield wall 40 is formed in triple walls as shown in FIG. 7.

As shown in FIGS. 6 and 7, in the shield apparatus 100 according to a second embodiment of the present invention, the outermost shield wall 40 has a high-conductivity metal layer 20 and a high-permeability soft magnetic layer 30 which are completely sealed, and the shield wall 40 installed in the middle has a first high-conductivity metal layer 22 partitioned into three segments respectively having a cross section of a "⌐" shape and a sealed high-permeability soft magnetic layer 30 installed to be spaced apart from the first partitioned high-conductivity metal layer 22 by a predetermined distance toward inside thereof. In addition, the innermost shield wall 40 has a second high-conductivity metal layer 23 partitioned into six segments respectively having a cross section of a "——" shape and a sealed high-permeability soft magnetic layer 30 installed to be spaced apart from the second partitioned high-conductivity metal layer 23 by a predetermined distance toward inside thereof. Accordingly, the high-conductivity metal layer provided in the outermost shield wall is configured in a sealed form, and since it is configured such that a shield wall at a further inner position has a further partitioned high-conductivity metal layer, the area of the high-conductivity metal layer is decreased.

The shield apparatus 100 according to a second embodiment of the present invention is sealed by the three shield walls 40 and has a measurement space 7 inside thereof. Accordingly, a sample is put into the measurement space 7, and a subtle magnetic field generated from the sample is measured by a precise magnetic sensor provided in the measurement space 7.

In a second embodiment of the present invention, a soft magnetic material of high permeability is used for the high-permeability soft magnetic layer 30, like in a first embodiment of the present invention. In addition, the high-conductivity metal layer 20, the partitioned first high-conductivity metal layer 22 and the partitioned second high-conductivity metal layer 23 may be formed as a metal layer of high electrical conductivity, such as a layer of aluminum, copper, silver, gold or the like.

Accordingly, a gap is formed between the segments of the first high-conductivity metal layer 22 spaced apart from each other by a specific distance. Since the gap is formed between the segments of the first high-conductivity metal layer 22, eddy current generated by an excitation magnetic field, which is generated by a magnetic field generation apparatus for exciting the sample, is prevented from being formed at the first high-conductivity metal layer 22. In addition, it is understood that the second high-conductivity metal layer 23 according to a second embodiment of the present invention has six segments in total and the segments of the second high-conductivity metal layers 23 are also spaced apart from each other by a specific distance.

Accordingly, since a plurality of the partitioned segments of the first high-conductivity metal layer 22 and the second high-conductivity metal layer 23 according to a second embodiment of the present invention respectively forms a gap of a specific distance, flow of eddy current according the excitation magnetic field generated in the measurement space 7 can be cut off.

The shield apparatus 100 having a high-conductivity metal layer 21 partitioned into a plurality of segments proposed in the first and second embodiments described above is only preferred embodiments, it is apparent that the scope of right of the present invention may not be limited to the embodiments. In addition, the shield wall 40 may be formed as four or five layer walls in some cases, and if it is possible to form a gap of a predetermined distance between the segments of the high-conductivity metal layer 21 and thus flow of eddy current can be cut off, the high-conductivity metal layer 21 may be partitioned in a variety of forms and shapes.

Hereinafter, a shield method using the shield apparatus 100 having a high-conductivity metal layer 21 partitioned into a plurality of segments according to an embodiment of the present invention described above will be described. FIG. 8 is a flowchart illustrating a shield method using a shield apparatus 100 having a high-conductivity metal layer 21 partitioned into a plurality of segments according to an embodiment of the present invention.

First, a sample is put into a measurement space 7 inside a shield wall 40 having a high-conductivity metal layer 21 partitioned into a plurality of segments S1. Then, the partitioned high-conductivity metal layer 21 may have a variety of forms as described above. Then, an external magnetic field is shielded by the shield wall 40 S2. Since the shield wall 40 may be formed as multiple walls, high-frequency and low-frequency magnetic fields flowing outside thereof are cut off.

Then, a strong excitation magnetic field is generated by a magnetic field magnetic field generation apparatus for exciting the sample S3. Next, a precise magnetic sensor provided inside the measurement space 7 measures a subtle magnetic field generated from the sample S4. Since the segments of the partitioned high-conductivity metal layer 21 are spaced apart from each other by a specific distance, eddy current flowing through the partitioned high-conductivity metal layer 21 according to the excitation magnetic field is cut off while the subtle magnetic field is measured and the subtle magnetic field is generated from the sample S5. Accordingly, the eddy current structurally flowing through the shield wall 40 is cut off.

Hereinafter, the configuration and action of the shield apparatus 200 including coil units 220 respectively formed at each corner according to an embodiment of the present invention will be described. FIG. 9 is a perspective view showing a shield apparatus 200 including coil units 220 respectively formed at each corner of a high-permeability soft magnetic field 30 according to a first embodiment of the present invention.

As shown in FIG. 9, the shield apparatus 200 including coil units 220 respectively formed at each corner according to an embodiment of the present invention includes a high-permeability soft magnetic layer 30 of high permeability having a shield function, a shield room 210 provided with a measurement space 7 therein, a plurality of holes 230 respectively formed at each vertex of the shield room 210, and a plurality of coil units 220 respectively formed by inserting a coil into two adjacent holes and winding the coil around a corner of the shield room 220. In addition, the shield apparatus 200 may include a power supply unit configured to apply current to the coil.

The high-permeability soft magnetic layer 30 configuring the shield room 210 may be formed of Mu-metal, permalloy, hypernom, ferrite, Magnifer 7904 or the like. Accordingly, when the high-permeability soft magnetic layer 30 is magnetized by an excitation magnetic field generated by a magnetic field generation apparatus provided in the measurement space to excite the sample, the high-permeability soft magnetic layer 30 is demagnetized if the power supply unit applies current to the coil unit, since a magnetic flux closed circuit is created in a specific direction.

Specifically, the coil unit may be formed through an electrical wiring which configures three coil groups respectively having four coils. That is, as shown in FIG. 9, four coils wound in parallel to each other in each of the x-axis, y-axis and z-axis directions may be defined as a coil group. The electrical wiring is formed by connecting the coil groups in series or in parallel. Accordingly, when current is applied to a specific coil group by the power supply unit, a magnetic flux closed circuit is created in the same direction along four surfaces configuring the high-permeability soft magnetic layer 30. For example, when four coils parallel to the x-axis direction is defined as a specific coil group and current is applied to the four coils, the magnetic flux closed circuit is created in the y-axis direction along the four surfaces configuring the high-permeability soft magnetic layer 30. In addition, if the power supply unit applies AC current of an amplitude continuously decreasing along time to the electrical wiring which configures a coil group and an induced magnetic field is formed, the magnetized high-permeability soft magnetic layer 30 may be demagnetized.

In addition, the shield room 210 may be formed in multiple layers. For example, the shield room 210 may include a high-permeability soft magnetic layer 30 of a hexahedron shape formed toward inside with six closed surfaces of high permeability and a high-conductivity metal layer 20 of a hexahedron shape formed toward outside with six closed surfaces of high conductivity, which has a high-frequency shield property and is spaced apart between the walls 40 by a predetermined distance. In addition, the high-permeability soft magnetic layer 30 may be formed to include at least any one of Mu-metal, permalloy, ferrite, hypernom, Magnifer 7904 and the like, and the high-conductivity metal layer 20 may be formed of aluminum, copper, brass, silver, gold or the like.

FIG. 10 is a cross-sectional view showing a shield apparatus 200 including coil units 220 respectively formed at each corner of a high-permeability soft magnetic layer 30 and having a high-conductivity metal layer 20 outside thereof according to a second embodiment of the present invention. As shown in FIG. 10, it is understood that the coil unit 220 is formed by winding a coil around each corner of the high-permeability soft magnetic layer 30. In addition, the shield apparatus 200 having the coil units 220 according to a second embodiment of the present invention is configured such that when the high-permeability soft magnetic layer 30 is magnetized, the magnetized high-permeability soft magnetic layer 30 may be demagnetizes by applying current to the coil by the power supply unit.

FIG. 11 is a cross-sectional view showing a shield apparatus 200 including coil units 220 respectively formed at each corner of a high-permeability soft magnetic layer 30 according to a third embodiment of the present invention. As shown in FIG. 11, the shield room of the third embodiment is formed as a four layer wall. Specifically, a high-permeability soft magnetic layer 30 is provided at the innermost side, and a coil unit 220 is formed at each corner of the high-permeability soft magnetic layer 30. Then, a high-conductivity metal layer 20 is provided outside the high-permeability soft magnetic layer 30, and a high-permeability soft magnetic layer 30 is provided again outside the high-conductivity metal layer. Then, a coil unit 220 is formed at each corner of the high-permeability soft magnetic layer 30, and a high-conductivity metal layer 20 is provided outside the high-permeability soft magnetic layer 30. The coil unit 220 is formed by winding a coil around each corner of the high-permeability soft magnetic layer 30, and when the high-permeability soft magnetic layer 30 is magnetized, the magnetized high-permeability soft magnetic layer 30 is demagnetizes by applying current to the coil by the power supply unit.

Hereinafter, a shield method and a demagnetizing method using the above-mentioned shield apparatus 200 including coil units 220 respectively formed at each corner according to an embodiment of the present invention will be described. FIG. 12 is a flowchart illustrating a shield method using a shield apparatus 200 including coil units 220 respectively formed at each corner according to an embodiment of the present invention.

First, a sample is put into a measurement space 7 of a sealed shield room 210 provided with a plurality of holes 230 respectively formed at each vertex, a high-permeability soft magnetic layer 30 of high permeability having a function of shielding a low-frequency magnetic field, and a high-conductivity metal layer 20 of high conductivity being arranged to be spaced apart from the high-permeability soft magnetic layer 30 by a predetermined distance and having a function of shielding a high-frequency magnetic field S10. Then, an external magnetic field is shielded by the shield room 210 S20. As described above, the shield room 210 may be formed as multiple layers and shields high-frequency and low-frequency external magnetic fields.

Then, a strong excitation magnetic field is generated by a magnetic field generation apparatus for exciting the sample S30. Next, a precise magnetic sensor provided in the measurement space 7 measures a micro magnetic field generated from the sample S40.

Then, the power supply unit applies AC current of an amplitude continuously decreasing along time to the coil unit formed at each corner of the high-permeability soft magnetic layer 30, and thus the magnetized high-permeability soft magnetic layer 30 is demagnetized S50.

In addition, FIG. 13 is a flowchart illustrating a demagnetizing method using a shield apparatus 200 including coil units 220 respectively formed at each corner according to an embodiment of the present invention. When a high-permeability soft magnetic layer 30 of high permeability having a low-frequency shield function and being provided in a sealed shield room 210 is magnetized, a power supply unit applies a specific current to a specific coil group of a plurality of coil units 220, which is formed by inserting a coil into a plurality of holes 230 respectively provided at each vertex of the high-permeability soft magnetic layer 30 and other holes 230 adjacent to the holes 230 and winding the coil around the corner S100.

Then, a magnetic flux closed circuit is created in the same direction along the four surfaces of the high-permeability soft magnetic layer 30 by the specific current S200. Then, the high-permeability soft magnetic layer 30 is demagnetized by controlling the power supply unit to change and decrease a value of the specific current applied to the coil unit 220 S300.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:

1. A shield apparatus to shield an external magnetic field in a subtle magnetic field measurement apparatus that includes a magnetic field generation apparatus for exciting a sample, the shield apparatus having a precise magnetic sensor therein to measure a subtle magnetic field emitted from the sample, the shield apparatus comprising:
   a shield wall comprising a high-conductivity metal layer and a high-permeability soft magnetic layer, the high-conductivity metal layer being partitioned into a plurality of segments having a high-frequency shield property, the segments having inner surfaces, outer surfaces opposed to the inner surfaces, and end surfaces, the end surfaces being spaced apart from each other to form a plurality of gaps between the segments in the high-conductivity metal layer, the high-permeability soft magnetic layer forming a closed shape and being spaced apart from the high-conductivity metal layer by a predetermined distance so as to seal therein a measurement space associated with measuring the subtle magnetic field, and
   wherein the shield wall shields the external magnetic field, and the gaps between the segments in the high-conductivity metal layer cut off a flow of eddy current induced by an excitation magnetic field generated by the magnetic field generation apparatus so that a magnetic field generated by the eddy current does not interfere with measuring the subtle magnetic field.

2. The shield apparatus according to claim 1, wherein the shield wall comprises an inner shield wall and an outer shield wall, the inner shield wall comprising the high-permeability soft magnetic layer and the high-conductivity metal layer partitioned into the plurality of segments, the outer shield wall comprising a second high-conductivity metal layer spaced apart from a second high-permeability soft magnetic layer by a second predetermined distance, the second high-conductivity metal layer and the second high-permeability soft magnetic layer forming closed shapes.

3. The shield apparatus according to claim 2, wherein the shield wall comprises a door that is enabled to be opened and closed to put in the sample and to input and output other apparatuses, the second high-conductivity metal layer and the second high-permeability soft magnetic layer forming closed shapes when the door is closed.

4. The shield apparatus according to claim 2, wherein since the second high-conductivity metal layer of the outer shield wall forms a closed shape, and the high-conductivity metal layer of the inner shield wall is partitioned into the plurality of segments, a total area of the second high-conductivity metal layer and the high-conductivity metal layer is decreased.

5. The shield apparatus according to claim 1, wherein the high-conductivity metal layer is formed of at least one material in a group consisting of aluminum, copper, brass, silver, and gold.

6. The shield apparatus according to claim 1, wherein the high-permeability soft magnetic layer is formed of at least one material in a group consisting of Mu-metal, permalloy, hypernom, ferrite, and Magnifer 7904.

7. A shield method of measuring a subtle magnetic field, the method comprising:
putting a sample into a measurement space of a shield wall, the shield wall comprising a high-conductivity metal layer and a high-permeability soft magnetic layer, the high-conductivity metal layer being partitioned into a plurality of segments having a high-frequency shield property, the segments having inner surfaces, outer surfaces opposed to the inner surfaces, and end surfaces, the end surfaces being spaced apart from each other to form a plurality of gaps between the segments in the high-conductivity metal layer, the high-permeability soft magnetic layer forming a closed shape and being spaced apart from the high-conductivity metal layer by a predetermined distance so as to seal therein the measurement space associated with measuring the subtle magnetic field;
shielding an external magnetic field by the shield wall;
generating an excitation magnetic field by a magnetic field generation apparatus provided in the measurement space to excite the sample; and
measuring the subtle magnetic field generated from the sample by a precise magnetic sensor provided in the measurement space, wherein in generating the excitation magnetic field and measuring the subtle magnetic field, the gaps between the segments in the high-conductivity metal layer cut off flow of eddy current through the high-conductivity metal layer induced by the excitation magnetic field so that a magnetic field generated by the eddy current does not interfere with the precise magnetic sensor measuring the subtle magnetic field.

8. The method according to claim 7, wherein the shield wall comprises an inner shield wall and an outer shield wall, the inner shield wall comprising the high-permeability soft magnetic layer and the high-conductivity metal layer partitioned into the plurality of segments, the outer shield wall comprising a second high-permeability soft magnetic layer spaced apart from a second high-conductivity metal layer by a second predetermined distance, the second high-conductivity metal layer and the second high-permeability soft magnetic layer forming closed shapes.

9. A shield apparatus having a precise magnetic sensor therein, for shielding an external magnetic field in an apparatus for measuring a subtle magnetic field of a sample, the shield apparatus for measuring the subtle magnetic field, the shield apparatus comprising:
a sealed shield room provided with a shield wall and a measurement space inside thereof, the shield wall including a high-conductivity metal layer of high conductivity having a high-frequency shield property and a high-permeability soft magnetic layer of high permeability being spaced apart from the high-conductivity metal layer by a predetermined distance toward inside thereof and having a low-frequency magnetic field shield property;
a plurality of holes respectively formed at each vertex of the high-permeability soft magnetic layer;
a plurality of coil units respectively formed by a coil inserted into a hole and another hole adjacent to the hole and the coil wound around each corner of the high-permeability soft magnetic layer; and
a power supply unit configured to apply current to the coil units.

10. The shield apparatus according to claim 9, wherein when four coils wound in parallel to each other in each of three independent axis directions of length, height and depth-wise directions of the high-permeability soft magnetic layer of a hexahedron are defined as a coil group, a coil unit has an electrical wiring which configures three independent coil groups by connecting the defined coil groups in series or in parallel, and when current is applied to a specific coil group, a magnetic flux closed circuit of a same direction is created along four surfaces of the hexahedron configuring the high-permeability soft magnetic layer.

11. The shield apparatus according to claim 9, wherein the high-permeability soft magnetic layer is formed of at least one material in a group consisting of Mu-metal, permalloy, ferrite, hypernom, and Magnifer 7904.

12. The shield apparatus according to claim 10, wherein when the high-permeability soft magnetic layer is magnetized, the power supply unit applies AC current of an amplitude continuously decreasing along time to the electrical wiring configuring the coil groups to form an induced magnetic field at the magnetized high-permeability soft magnetic layer, and thus the high-permeability soft magnetic layer is demagnetized.

13. A shield method of measuring a subtle magnetic field using the shield apparatus according to claim 9, the method comprising:
putting a sample into a measurement space of a sealed shield room, the sealed shield room provided with a plurality of holes respectively formed at each vertex, a high-permeability soft magnetic layer of high permeability having a low-frequency shield property and a high-conductivity metal layer of high conductivity having a high-frequency shield property;
shielding an external magnetic field by the shield room;
generating a demagnetizing magnetic field by a magnetic field generation apparatus installed to excite the sample;
measuring the subtle magnetic field generated from the sample by a precise magnetic sensor provided in the measurement space; and
demagnetizing the high-permeability soft magnetic layer magnetized by the excitation magnetic field, by applying AC current of a continuously decreasing amplitude flowing through a plurality of coil units respectively formed by inserting a coil into a hole and another hole adjacent to the hole and winding the coil around each corner.

14. A demagnetizing method of measuring a subtle magnetic field using the shield apparatus according to claim 12, the method comprising:
when a high-permeability soft magnetic layer of high permeability having a low-frequency shield property and configuring a sealed shield room is magnetized, applying a specific current by a power supply unit to a plurality of coil units respectively formed by inserting a coil into a plurality of holes respectively provided at each vertex of the high-permeability soft magnetic layer and other holes adjacent to the holes and winding the coil around each corner;
creating a magnetic flux closed circuit at the high-permeability soft magnetic layer by the specific current; and
demagnetizing the high-permeability soft magnetic layer by changing a value of the specific current.

15. The shield apparatus according to claim 2, wherein the shield wall further comprises a middle shield wall disposed between the inner shield wall and the outer shield wall, the middle shield wall comprising a third high-permeability soft magnetic layer spaced apart from a third high-conductivity metal layer partitioned into a second plurality of segments having a high-frequency shield property, the third high-permeability soft magnetic layer forming a closed shape and being spaced apart from the high-conductivity metal layer by a second predetermined distance, the second segments being spaced apart from each other to form a plurality of second gaps between the second segments in the third high-conductivity metal layer.

16. The shield apparatus according to claim 15, wherein the segments in the high-conductivity metal layer of the inner shield wall differ from the second segments in the third high-conductivity metal layer of the middle shield wall in number and shape.

17. The shield apparatus according to claim 16, wherein there are six segments in the high-conductivity metal layer and three segments in the third high-conductivity metal layer.

18. The shield apparatus according to claim 16, wherein each of the segments in the conductivity metal layer has a planar surface and each of the second segments in the third high-conductivity metal layer has a surface forming an angle.

19. The method according to claim 8, wherein the method further comprises putting the sample into the measurement space of the shield wall through a door, wherein the second high-conductivity metal layer and the second high-permeability soft magnetic layer form closed shapes when the door is closed.

20. The method according to claim 8, wherein since the second high-conductivity metal layer of the outer shield wall forms a closed shape, and the high-conductivity metal layer of the inner shield wall is partitioned into the plurality of segments, a total area of the second high-conductivity metal layer and the high-conductivity metal layer is decreased.

* * * * *